US006746880B2

United States Patent
Birner et al.

(10) Patent No.: US 6,746,880 B2
(45) Date of Patent: Jun. 8, 2004

(54) METHOD FOR MAKING ELECTRICAL CONTACT WITH A REAR SIDE OF A SEMICONDUCTOR SUBSTRATE DURING ITS PROCESSING

(75) Inventors: Albert Birner, Dresden (DE); Martin Franosch, München (DE); Matthias Goldbach, Dresden (DE); Volker Lehmann, München (DE); Jörn Lützen, Dresden (DE)

(73) Assignee: Infineon Technologies AG, Munich (DE)

( * ) Notice: Subject to any disclaimer, the term of this patent is extended or adjusted under 35 U.S.C. 154(b) by 127 days.

(21) Appl. No.: 09/871,013

(22) Filed: May 31, 2001

(65) Prior Publication Data
US 2001/0055858 A1 Dec. 27, 2001

(30) Foreign Application Priority Data
May 31, 2000 (DE) .......................... 100 27 931

(51) Int. Cl.[7] .............................................. H01L 21/00
(52) U.S. Cl. ........................... 438/10; 438/421; 257/466
(58) Field of Search ................... 438/10, 421; 117/200; 204/192.37

(56) References Cited

U.S. PATENT DOCUMENTS

| 4,428,815 A | 1/1984 | Powell et al. |
| 4,876,224 A | 10/1989 | Kusakabe |
| 5,209,833 A | 5/1993 | Foell et al. |
| 5,437,777 A | 8/1995 | Kishi |
| 5,463,526 A | 10/1995 | Mundt |
| 5,511,428 A * | 4/1996 | Goldberg et al. ............. 73/777 |
| 5,911,461 A | 6/1999 | Sauter et al. |
| 6,217,724 B1 * | 4/2001 | Chu et al. ............. 204/192.37 |
| 6,444,027 B1 * | 9/2002 | Yang et al. ................. 117/200 |

FOREIGN PATENT DOCUMENTS

| DE | 197 28 962 A1 | 1/1999 |
| EP | 0 806 798 A2 | 11/1997 |
| GB | 2 149 697 A | 6/1985 |
| GB | 2 171 556 A | 8/1986 |
| JP | 59041830 A | 3/1984 |
| JP | 62293632 A | 12/1987 |
| JP | 10046394 A | 2/1998 |
| JP | 11181600 A | 7/1999 |

* cited by examiner

*Primary Examiner*—W. David Coleman
(74) *Attorney, Agent, or Firm*—Laurence A. Greenberg; Werner H. Stemer; Ralph E. Locher

(57) ABSTRACT

A method for electrically contacting a rear side of a semiconductor substrate when processing the semiconductor substrate includes the step of placing the semiconductor substrate with a substrate rear side on a substrate holder such that an electrically conductive contact layer formed of a semiconductor material is disposed between the semiconductor substrate and the substrate holder.

18 Claims, 2 Drawing Sheets

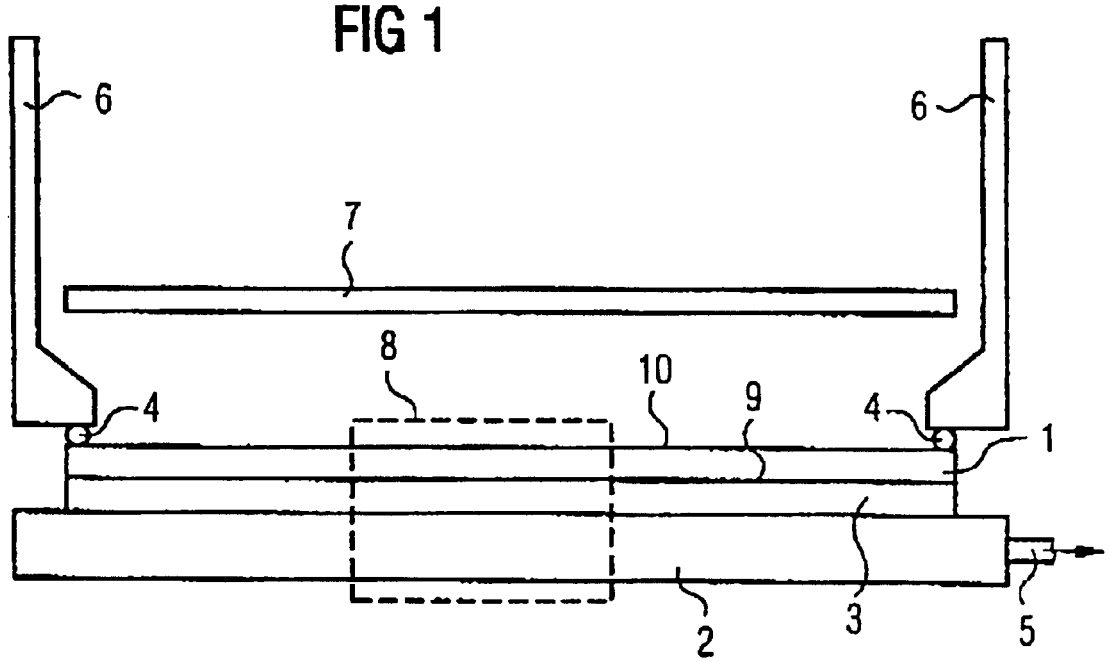
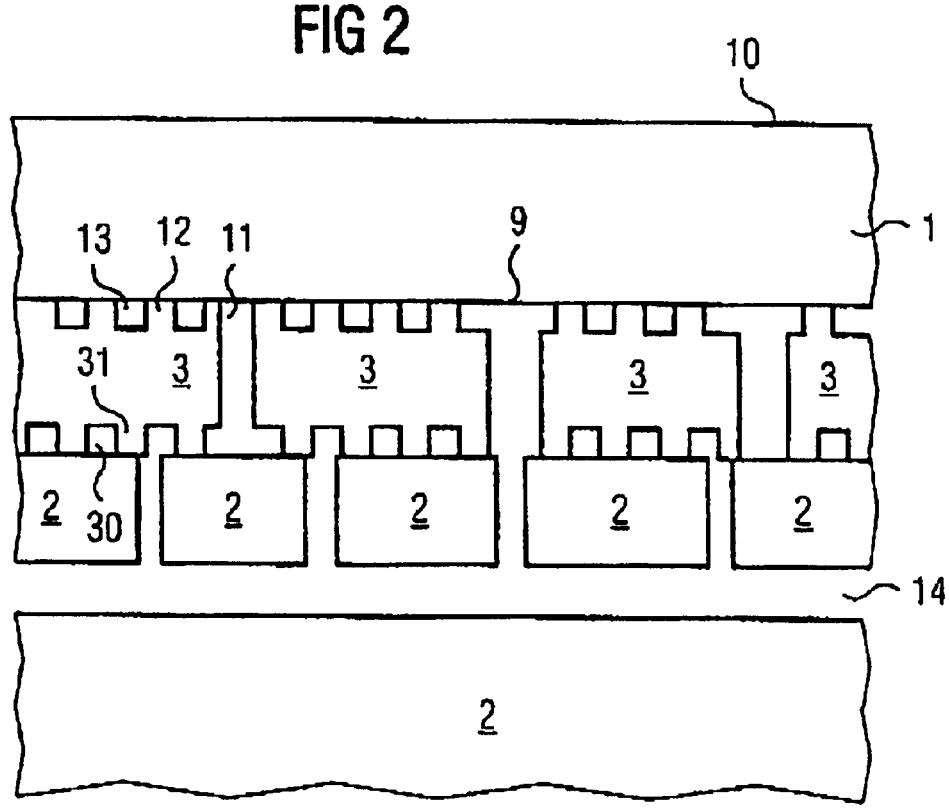

METHOD FOR MAKING ELECTRICAL CONTACT WITH A REAR SIDE OF A SEMICONDUCTOR SUBSTRATE DURING ITS PROCESSING

BACKGROUND OF THE INVENTION

Field of the Invention

The invention relates to a method for making electrical contact with the rear side of a semiconductor substrate when processing the semiconductor substrate.

When manufacturing semiconductor components, process steps are used which require an electrical contact to the substrate to be processed. This is the case, for example, in electrical or electrochemical process steps. In order to be able to manufacture a large number of identical components in parallel on a semiconductor substrate, it is necessary for the substrate to be processed uniformly by the process step. This requires contacting methods which make electrical contact with the substrate in a way which is as homogenous as possible. If a homogenous electrical contact is not ensured, there is a variation in the electrical potential over the substrate, which can become manifest in an inhomogenous process control and can prevent a uniform execution of the process step. The fluctuation leads to a non-uniform galvanic deposition (in the case of a negative substrate potential) and to non-uniform anodic dissolving (in the case of a positive substrate potential).

In the case of the anodic dissolving of the substrate, given, for example, a suitably selected doping and electrolyte composition, pores are formed when there is a low anodic potential and electropolished surfaces are formed when there is a high anodic potential. This constitutes a considerable dependence of the semiconductor components to be formed on the potential applied and may prevent that properly functioning semiconductor components are formed.

The formation of pores in silicon is of interest, for example, for manufacturing trench capacitors because the formation of pores allows a considerable increase of the surface and thus allows to realize an associated increase in capacitance. Especially suitable pores are referred to as "mesopores" with a pore diameter in the range of 2–10 nanometers (nm). Since, as already mentioned above, the formation of pores depends on the electrical potential, it is of great importance to apply this potential as uniformly as possible over the substrate.

Published, Non-Prosecuted German Patent Application DE 197 28 962 A1 describes, for example, a device for etching a semiconductor wafer. The device is suitable, for example, for etching a main surface of the semiconductor wafer. Electrical contact is made with the semiconductor wafer from the rear side in its edge region.

Japanese Patent Document JP 59-41830 A relates to a mounting device for a semiconductor substrate, through the use of which a fluid for electroplating the semiconductor substrate is sprayed onto the semiconductor substrate. Here also, the electrical contact is made in the rear-side edge region.

U.S. Pat. No. 4,428,815 relates to a vacuum mounting device for mounting fragile objects such as, for example, semiconductor substrates. Electrical contact is made through the use of rear-side contact elements in the center of the substrate.

U.S. Pat. No. 5,437,777 relates to a system for depositing a wiring plane on a semiconductor wafer. Needle electrodes are installed on the front side of the substrate in order to make electrical contact with the front side of the substrate.

Japanese Patent Document JP 10-046394 A relates to an electroplating system and a method for a galvanic depositing, for example, of a metallic layer. Here, a mounting device for the semiconductor wafer is embodied in such a way that the contact is made with the semiconductor wafer at its periphery.

Japanese Patent Document JP 62-293632 A describes an insulating layer which is provided with holes and is provided between the semiconductor wafer and a chuck.

Japanese Patent Document JP 11-181600 A relates to a method for checking the electrical contact of connecting pins of an electroplating device. The connecting pins are connected to a conductive film which is provided on the wafer. In order to check the electrical contact of a connecting pin, the electrical resistance of this connecting pin is determined with respect to the other connecting pins.

A conventional method for making contact uniformly over the entire rear side is shown, for example, in U.S. Pat. No. 5,209,833. An electrolytic contact is made with the rear side of the substrate, which contact ensures a very low fluctuation of the contact resistance between the substrate and electrolyte.

The method for making electrolytic rear-side contact over the entire surface is, however, costly in terms of process technology because the electrolyte always requires a wet cell.

SUMMARY OF THE INVENTION

It is accordingly an object of the invention to provide a method for electrically contacting a rear side of a semiconductor substrate which overcomes the above-mentioned disadvantages of the heretofore-known methods of this general type and which provides a uniform contact with the semiconductor substrate.

With the foregoing and other objects in view there is provided, in accordance with the invention, a method for electrically contacting a rear side of a semiconductor substrate when processing the semiconductor substrate, the method includes the steps of:

providing a semiconductor substrate having a substrate rear side and a substrate front side disposed opposite from the substrate rear side and, if appropriate, removing an insulating layer disposed on the substrate rear side; and placing the semiconductor substrate with the substrate rear side on a substrate holder such that an electrically conductive contact layer formed of a semiconductor material is disposed between the semiconductor substrate and the substrate holder.

In other words, the object of the invention is achieved by a method for making electrical contact with the rear side of a semiconductor substrate during its processing, wherein a substrate is provided, which has a substrate rear side and a substrate front side located opposite the latter, with an insulating layer on the substrate rear side removed from it, and the substrate is provided with its substrate rear side on a substrate holder, and an electrically conductive layer made of a semiconductor material is provided between the substrate and the substrate holder.

The advantage of the method according to the invention is due to the fact that an electrolytic contact which would require a costly wet cell can be dispensed with. Instead, the electrical connection is made according to the invention through the use of an electrically conductive contact layer which can be used in combination with a substrate holder which is, for example, a metallic or metal-coated vacuum chuck. Here, for example, the conductive contact layer is firstly provided on the chuck and the substrate is subsequently provided on the conductive contact layer.

The electrical contact serves, for example, in electrical or electrochemical processes, to permit a uniform flow of current from the front side of the substrate to the substrate holder.

In one embodiment of the invention, the conductive contact layer is formed as a diffusion barrier for materials of which the substrate holder is composed. Without a diffusion barrier, a vacuum chuck provided with a gold layer could contaminate a semiconductor substrate composed of silicon, the gold atoms forming impurities or defects in the silicon substrate, as a result of which the functions of a field effect transistor can be disrupted.

A further embodiment of the invention provides for a conductive contact layer to be formed from a semiconductor material. The use of a semiconductor material, or preferably the use of the same semiconductor material as the substrate can suitably prevent the contamination of the substrate.

Furthermore, according to another mode of the invention, a conductive contact layer is doped with the same type of charge carrier or dopants as the substrate. Using the same type of charge carrier advantageously avoids a pn-type junction which has a diode blocking effect in a direction of current flow. By using the same type of charge carrier, a low-impedance electrical contact is made possible between the substrate and the conductive layer. In order to achieve a low resistance in the conductive contact layer, the conductive contact layer is provided with a high dopant concentration. Because the substrate is usually rather weakly doped on its rear side, the high doping of the conductive contact layer achieves a homogenous distribution of current on the rear side of the substrate.

According to another mode of the invention, a trench is formed in the conductive contact layer in a surface facing the substrate. The formation of a trench in a surface of the conductive contact layer facing the rear side of the substrate makes it possible to press the rear side of the substrate and thus the substrate against the conductive contact layer by virtue of a vacuum provided in the trench. Pressing the substrate against the conductive contact layer permits a low-impedance contact between the conductive contact layer and the substrate.

According to another mode of the invention, a mesa is formed in the conductive contact layer in a surface facing the substrate. A mesa is, in contrast to a trench, a structure which is surrounded by a trench and which projects beyond its surroundings as an elevation. The mesa is, for example, suitable for an operation in which the rear side of the substrate is pressed against the mesa and a low-impedance electrical contact is thus achieved between the rear side of the substrate and the mesa. This can be achieved through the use of a vacuum which is provided in a trench which surrounds the mesa.

The trenches and mesas which are provided on the surface of the conductive contact layer facing the substrate serve to provide a uniform distribution of the contact pressure of the substrate against the conductive contact layer by virtue of a suitable configuration of trenches and mesas. For example, a checkerboard-like pattern of trenches and/or mesas is suitable here for providing, on the entire rear side of the substrate, a uniform distribution of the vacuum and electrical contact which can be provided by the mesas.

Furthermore, a hole may be formed in the conductive contact layer which hole extends from a surface facing the substrate to a surface, facing the substrate holder, of the conductive contact layer. The configuration of a hole which extends through the conductive contact layer makes it advantageously possible to use the vacuum device of the vacuum chuck for pressing the substrate against the conductive contact layer. This is particularly advantageous because vacuum chucks are already equipped with a vacuum connection and vacuum holes in the surface of the vacuum chuck facing the substrate. This avoids the necessity of a separate vacuum device for the conductive contact layer.

It is also advantageous if a second trench is formed in the conductive contact layer in a surface facing the substrate carrier. As described above, the first trench serves for pressing the substrate against a conductive contact layer through the use of a vacuum. The second trench serves to conduct the vacuum from the vacuum holes in the surface of the substrate carrier through the conductive contact layer.

Furthermore, it is advantageous to form a second mesa in the conductive contact layer in a surface facing the substrate carrier. A pattern which includes the second trench and the second mesa is suitable, for example, for permitting a process in which the conductive contact layer is positioned on the substrate carrier without fine adjustment to the vacuum openings provided by the substrate carrier. The vacuum is conveyed through the conductive contact layer from the substrate carrier to the substrate through the use of the second trench and the hole.

In a further method step there is provision for a lower pressure to be generated in the trench than at the front side of the substrate. Through the use of the pressure difference between the front side of the substrate and the trench, the substrate is pressed against the conductive contact layer and the conductive contact layer is thus pressed against the substrate holder.

Other features which are considered as characteristic for the invention are set forth in the appended claims.

Although the invention is illustrated and described herein as embodied in a method for making electrical contact with the rear side of a semiconductor substrate during its processing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view of an electrochemical process chamber with a substrate holder, a conductive contact layer and a substrate for illustrating the method according to the invention;

FIG. 2 is a diagrammatic, partial sectional view of the substrate holder, of the conductive contact layer and of the substrate according to the invention;

DESCRIPTION OF THE PREFERRED EMBODIMENTS

Figure 3:
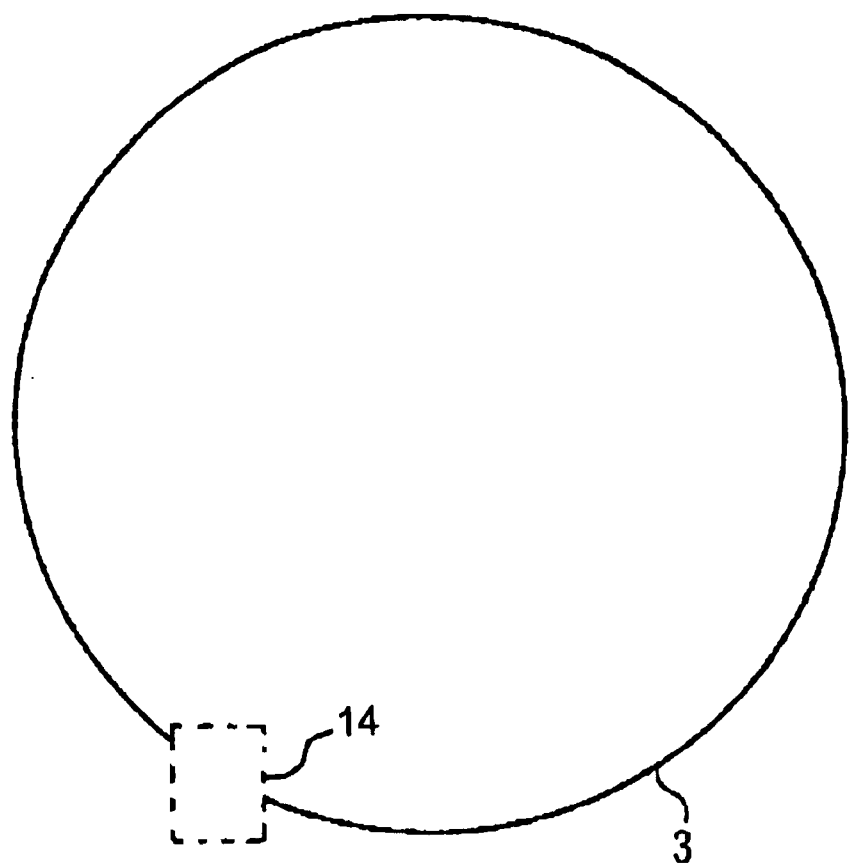
FIG. 3 is diagrammatic plan view of a conductive contact layer according to the invention.

Referring now to the figures of the drawings in detail and first, particularly, to FIG. 1 thereof, there is shown a substrate holder 2, which may for example be a vacuum chuck. The substrate holder 2 has a vacuum connection 5 for evacuating gases. A contact layer 3 is provided on the substrate holder 2. The contact layer 3 is manufactured, for example, from a conductive semiconductor material such as highly doped silicon or gallium arsenide. A substrate 1 with a substrate rear side facing the conductive contact layer 3 and a substrate front side facing away from the conductive contact layer 3 is provided on the conductive contact layer 3. The substrate 1 contains silicon, for example. In this exemplary embodiment a sealing ring 4 is provided on the substrate 1, on its edge. An etching cup 6, which has a tubular shape, is provided on the sealing ring 4. The etching cup 6 serves, for example, for holding an etching agent which in this case wets the surface 10 of the substrate. Furthermore, a corresponding electrode 7 is provided in the etching cup 6. The corresponding electrode 7 is, for example, a lattice or a plate composed, for example, of platinum, wherein the embodiment of a lattice permits light to pass through. In a process in the etching cup 6, a current flows, for example, from the corresponding electrode 7 through the etching agent to the front side 10 of the substrate, through the substrate to the rear side 9 of the substrate at which the current enters the conductive contact layer 3, through the conductive contact layer 3 and to the substrate holder 2. In order to achieve uniform processing of the front side 10 of the substrate, it is advantageous if the current enters the front side 10 of the substrate perpendicularly from the etching agent with a uniform current density.

The conductive contact layer 3 is composed here, for example, of a highly doped silicon wafer. The highly doped silicon wafer has the advantage that it permits a low-impedance electrical contact on both sides. A low-impedance electrical connection is thus obtained between the rear side 9 of the substrate and the substrate holder 2. The region 8 shown by broken lines is illustrated in FIG. 2 and explained in more detail below.

The region 8 from FIG. 1 is illustrated in FIG. 2. The substrate holder 2 has here a vacuum line 14 which extends, for example, to a surface of the substrate holder 2. The conductive contact layer 3 is provided on the substrate holder 2. The substrate 1 is in turn provided with its substrate rear side 9 on the conductive contact layer 3. The conductive contact layer 3 is embodied in this exemplary embodiment in such a way that it has a trench 13 and a mesa 12 in the surface facing the substrate. Furthermore, a hole 11 running from the surface facing the substrate 1 to the surface facing the substrate holder extends through the conductive contact layer 3. A second trench 30 and a second mesa 31 are provided on the surface facing the substrate holder 2. The mesa 12 facing the substrate rear side 9 and trench 13 serve to distribute uniformly over the rear side 9 of the substrate, the vacuum provided by the substrate holder 2, with the result that the substrate 1 is uniformly pressed against the conductive contact layer 3. The hole 11 then serves to conduct the vacuum from the vacuum line 14 through the conductive contact layer 3.

For a p-type doped substrate 1, for example a highly p-type doped conductive contact layer 3 made of silicon is positioned on the substrate holder 2. If the substrate 1 is n-doped, the conductive contact layer 3 is formed from a highly n-type doped semiconductor material. In order to be able to use the substrate holder 2 in a variable fashion, the conductive contact layer 3 can be loosely positioned on the substrate holder 2 in order to exchange the conductive contact layer 3 if appropriate through the use of another conductive contact layer 3 with another type of dopant. In a further exemplary embodiment it is, for example, possible to deposit the conductive contact layer 3 directly on the substrate holder 2 through the use of a CVD (Chemical Vapor Deposition) method and thus connect it permanently to the substrate holder 2.

In the event of the conductive contact layer 3 being loosely provided on the substrate holder 2, it is necessary to adjust the hole 11 with respect to the vacuum line 14 in order to conduct the vacuum from the substrate holder 2 to the substrate 1. The second mesa 31 and the second trench 30 make it possible, however, to dispense with an adjustment step because whatever the positioning of the conductive contact layer 3 it is always ensured that a second trench 30 comes to rest over a vacuum line 14 and the vacuum is thus conveyed through the second trench 30 via the hole 11 to the rear side 9 of the substrate.

In order to manufacture the mesa structure on both sides of the conductive contact layer 3, it is possible, for example, to use a lithographic step such as stepper exposure or contact lithography. In this context, for example, a masking layer made of silicon oxide or silicon nitride is formed and the mesa structure itself is manufactured through the use of plasma etching or through the use of wet chemical etching, for example, with a lye such as KOH or $NH_4OH$. If the mesa 12 is embodied, for example, as a parallelepiped-shaped contact projection or formed as a truncated pyramid, adjacent contact projections may be provided in a hexagonal pattern. The individual contact projections can be, for example, 800 $\mu$m apart. Here, the individual contact projections have an edge length in the range of 100 to 400 $\mu$m. By reducing the edge length of the contact projections it is possible to correspondingly increase the contact pressure. If the contact projections are formed as truncated pyramids, the etching may proceed to such an extent that the contact projections are formed as pyramids with a tip. The large lattice constant of the hexagonal pattern and the small bearing surface of the truncated pyramids or of the contact tips of the pyramid allows to minimize disruptive influences of a slight unevenness on the substrate 1 such as occur, for example, due to bending, particles or a roughness of the rear side 9 of the substrate.

It is, for example, also possible to attach the conductive contact layer 3 to the substrate holder 2 through the use of clamps or conductive bonding.

Depending on the dopant concentration of the rear side 9 of the substrate, which influences the conductivity of the substrate 1, it may be necessary to provide the rear side 9 of the substrate with a higher dopant concentration through the use of an additional implantation step.

If, for example, the substrate holder 2 is coated with a highly doped polysilicon layer, this layer is formed with a thickness of several $\mu$m. A mesa structure in accordance with the steps given above, can be subsequently produced in the silicon layer.

Furthermore, it is possible to provide the substrate holder 2 with a suitable mesa structure on its surface and to subsequently cover this mesa structure with a thin, highly doped polysilicon layer. This ensures that the mesa structure of the substrate holder 2 is preserved on the surface of the conductive contact layer 3 facing the substrate.

Figure 4:
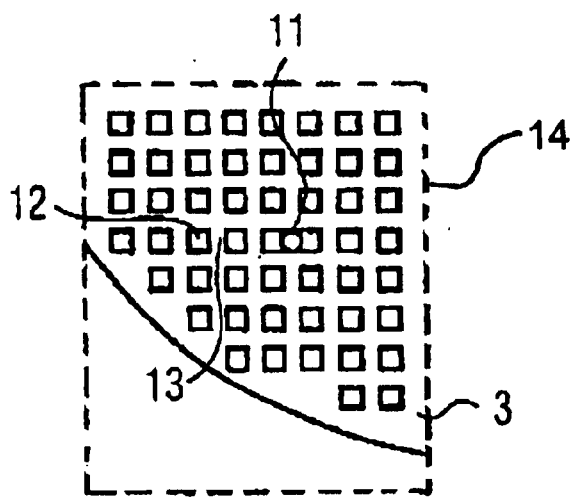
FIG. 4 is a diagrammatic plan view of a detail of the conductive contact layer of FIG. 3 for illustrating the conductive contact layer with a configuration of trenches and mesas according to the invention.

FIG. 3 is diagrammatic plan view of a conductive contact layer 3. A partial region 14 along the edge of the conductive contact layer 3 is indicated with a broken line. FIG. 4 is an enlarged, detailed view of the partial region 14 of the conductive contact layer 3 of FIG. 3. FIG. 4 illustrates how the holes 11, mesas 12, and trenches 13 are disposed in the conductive contact layer 3.

We claim:

1. A method for electrically contacting a rear side of a semiconductor substrate when processing the semiconductor substrate, the method comprising:
   providing a substrate holder having a vacuum line for producing a vacuum;
   providing a semiconductor substrate having a substrate rear side and a substrate front aide disposed opposite from the substrate rear side, the semiconductor substrate being doped with charge carriers having a first polarity;
   providing an electrically conductive contact layer formed of a semiconductor material doped with charge carriers having the first polarity;
   forming a first trench in the electrically conductive contact layer starting from a first surface of the electrically conductive contact layer;
   forming a second trench in the electrically conductive contact layer starting from a second surface of the electrically conductive contact layer;
   forming a hole in the electrically conductive contact layer extending from the first surface of the electrically conductive contact layer to the second surface of the electrically conductive contact layer;
   removing an insulating layer disposed on the substrate rear side;
   placing the semiconductor substrate with the substrate rear side on the substrate holder with the electrically conductive contact layer being disposed between the semiconductor substrate and the substrate holder, the first side of the electrically conductive contact layer facing the semiconductor substrate and the second side of the electrically conductive contact layer facing the substrate holder; and
   applying a vacuum to the vacuum line, feeding the vacuum through the hole from the second surface of the electrically conductive contact layer to the first surface of the electrically conductive contact layer, and distributing the vacuum uniformly over the rear side of the semiconductor substrate.

2. The method according to claim 1, which comprises providing the electrically conductive contact layer as a diffusion barrier against materials forming the substrate holder.

3. The method according to claim 1, which comprises providing the electrically conductive contact layer as a doped layer wherein the electrically conductive contact layer and the semiconductor substrate are doped with a same type of charge carriers.

4. The method according to claim 1, which comprises forming the first trench in the electrically conductive contact layer starting from the first surface of the electrically conductive contact layer facing the semiconductor substrate.

5. The method according to claim 1, which comprises forming a mesa in a surface of the electrically conductive contact layer facing the semiconductor substrate.

6. The method according to claim 1, which comprises forming the hole in the electrically conductive contact layer such that the hole extends from a surface of the electrically conductive contact layer facing the semiconductor substrate to a further surface of the electrically conductive contact layer facing the substrate holder.

7. The method according to claim 1, which comprises:
   forming the first trench in the electrically conductive contact layer starting from the first surface of the electrically conductive contact layer facing the semiconductor substrate; and
   forming the second trench in the electrically conductive contact layer starting from the second surface of the electrically conductive contact layer facing the substrate holder.

8. The method according to claim 1, which comprises:
   forming a first mesa in a surface of the electrically conductive contact layer facing the semiconductor substrate; and
   forming a second mesa in a surface of the electrically conductive contact layer facing the substrate carrier.

9. The method according to claim 4, which comprises generating a given pressure in one of the first and second trenches, the given pressure in the one trench being lower than a pressure at the substrate front side.

10. A method for electrically contacting a rear side of a semiconductor substrate when processing the semiconductor substrate, the method comprising:
    providing a substrate holder having a vacuum line for producing a vacuum;
    providing a semiconductor substrate having a substrate rear side and a substrate front side disposed opposite from the substrate rear side, the semiconductor substrate being doped with charge carrier having a first polarity;
    providing an electrically conductive contact layer formed of a semiconductor material doped with charge carriers having the first polarity;
    forming a first trench in the electrically conductive contact layer starting from a first surface of the electrically conductive contact layer;
    forming a second trench in the electrically conductive contact layer starting from a second surface of the electrically conductive contact layer;
    forming a hole in the electrically conductive contact layer extending from the first surface of the electrically conductive contact layer to the second surface of the electrically conductive contact layer;
    placing the semiconductor substrate with the substrate rear side on the substrate holder with the electrically conductive contact layer being disposed between the semiconductor substrate and the substrate holder for electrically contacting the substrate rear side when processing the semiconductor substrate, the first side of the electrically conductive contact layer facing the semiconductor substrate and the second side of the electrically conductive contact layer facing the substrate holder; and
    applying a vacuum to the vacuum line, feeding the vacuum through the hole from the second surface of the electrically conductive contact layer to the first surface of the electrically conductive contact layer, and distributing the
    vacuum uniformly over the rear side of the semiconductor substrate.

11. A method for electrically contacting a rear side of a semiconductor substrate when processing the semiconductor substrate, the method comprising:
    providing a substrate holder having a vacuum line for producing a vacuum;
    providing a semiconductor substrate having a substrate rear side and a substrate front side disposed opposite from the substrate rear side, the semiconductor substrate being doped with charge carriers having a first polarity;

providing an electrically conductive contact layer formed of a semiconductor material doped with charge carriers having the first polarity;

forming a first mesa in the electrically conductive contact layer starting from a first surface of the electrically conductive contact layer;

forming a second mesa in the electrically conductive contact layer starting from a second surface of the electrically conductive contact layer;

forming a hole in the electrically conductive contact layer extending from the first surface of the electrically conductive contact layer to the second surface of the electrically conductive contact layer;

removing an insulating layer disposed on the substrate rear side; and placing the semiconductor substrate with the substrate rear side on the substrate holder with the electrically conductive contact layer being disposed between the semiconductor substrate and the substrate holder, the first side of the electrically conductive contact layer facing the semiconductor substrate and the second side of the electrically conductive contact layer facing the substrate holder; and applying a vacuum to the vacuum line, feeding the vacuum through the hole from the second surface of the electrically conductive contact layer to the first surface of the electrically conductive contact layer, and distributing the vacuum uniformly over the rear side of the semiconductor substrate.

12. The method according to claim 11, which comprises providing the electrically conductive contact layer as a diffusion barrier against materials forming the substrate holder.

13. The method according to claim 11, which comprises providing the electrically conductive contact layer as a doped layer wherein the electrically conductive contact layer and the semiconductor substrate are doped with a same type of charge carriers.

14. The method according to claim 11, which comprises forming the hole in the electrically conductive contact layer such that the hole extends from a surface of the electrically conductive contact layer facing the semiconductor substrate to a further surface of the electrically conductive contact layer facing the substrate holder.

15. The method according to claim 11, which comprises forming the first mesa in the electrically conductive contact layer starting from the first surface of the electrically conductive contact layer facing the semiconductor substrate.

16. The method according to claim 11, which comprises forming the first mesa in the first surface of the electrically conductive contact layer facing the semiconductor substrate.

17. The method according to claim 11, which comprises:

forming the first mesa in the electrically conductive contact layer starting from the first surface of the electrically conductive contact layer facing the semiconductor substrate; and forming the second mesa in the electrically conductive contact layer starting from the second surface of the electrically conductive contact layer facing the substrate holder.

18. The method according to claim 11, which comprises:

forming the first mesa in the first surface of the electrically conductive contact layer facing the semiconductor substrate; and forming the second mesa in the second surface of the electrically conductive contact layer facing the substrate carrier.

* * * * *